United States Patent [19]
Ogura

[11] Patent Number: 5,904,975
[45] Date of Patent: May 18, 1999

[54] PRINTED CIRCUIT BOARD

[75] Inventor: Akio Ogura, Nagoya, Japan

[73] Assignee: Brother Kogyo Kabushiki Kaisha, Nagoya, Japan

[21] Appl. No.: 08/848,193

[22] Filed: Apr. 29, 1997

[30] Foreign Application Priority Data

May 20, 1996 [JP] Japan ..................... 8-125139

[51] Int. Cl.⁶ ..................... B32B 9/00
[52] U.S. Cl. ..................... 428/209; 174/250; 174/258; 428/901; 427/261; 427/265; 427/282
[58] Field of Search ..................... 428/209; 427/282, 427/261, 265; 174/250, 258

[56] References Cited

U.S. PATENT DOCUMENTS 4,835,038  5/1989  Kaneko et al. ..................... 428/209
5,208,066  5/1993  Fujisaki et al. ..................... 427/282
5,674,595  10/1997  Busacco et al. ..................... 174/258

Primary Examiner—William Krynski
Assistant Examiner—Cathy F. Lam
Attorney, Agent, or Firm—Oliff & Berridge, PLC

[57] ABSTRACT

A printed circuit board in accordance with the invention includes an electrically insulated board. A plurality of patterns include electrically conductive members are provided on the board and have electrode units for electrical connection. The electrode units are provided adjacent to each other and are separated at a tip section of the pattern. Electrically insulated covering members cover the pattern except for the electrode units. Electrically insulated separation members are provided in the space between the electrode units.

12 Claims, 7 Drawing Sheets

PRINTED CIRCUIT BOARD

BACKGROUND OF THE INVENTION

1. Field of the Invention

The invention relates to electronic parts mounted on printed circuit boards, and specifically to the technology of mounting electronic parts on printed circuit boards.

2. Description of Related Art

Conventional soldering apparatuses solder electronic parts on printed circuit boards all at once, as is the case with mass production. However, soldering is performed differently in the case of soldering pins which are adjacent to each other and separated by an extremely small space. The soldering pins are provided on adjacent electrode units which are likewise separated by an extremely small space corresponding to the separation of the pins on the printed circuit board. Machines which use this setup include a thermal head of a facsimile machine and a printer. In such a case, soldering is performed manually for each pin in order to prevent the formation of a soldering bridge.

For example, FIG. 1 shows a conventional manufacturing process for a printed circuit board. First, copper 2 is provided (step 1) on the board 1 as a conductive member. The board 1 is formed of phenol resin or a similar material.

Ink 3 is then coated (step 2) by printing on a section of the copper 2 on which a pattern is formed. The pattern is formed according to a pre-designed pattern arrangement. A portion of the copper 2 outside of the section on which the ink 3 is printed is removed by etching (step 3). Then, the pattern 4 is formed on the board 1 by removing the ink 3 which remained defining the pattern (step 4).

Next, in order to prevent short circuits between patterns 4 during soldering, a covering member 6 is provided on the pattern 4 and the board 1 by printing using a printing sheet having a printing pattern. The printing sheet has a transferring pattern except for the positions corresponding to the electrode units 5 in the patterns 4 and the covering member 6 is coated by insulated material through the transferring pattern (step 5). As a result, the board 1 and the patterns 4 are insulated except for the electrode units 5, and short circuits between the patterns 4 is prevented during soldering and similar operations. Subsequently, characters 7 and the like are provided on the covering member 6 by silk sheet printing to provide information regarding the process (step 6).

However, the pitch of pins in such machines is often only about 1 mm. Thus, numerous soldering bridges can still be formed even when soldering is performed manually.

Such soldering bridges are discovered only when the power source of the machine is turned on after manufacturing is completed. Discovering soldering bridges at this time lowers production efficiency.

This problem can be solved by widening the space between electrode units in the pattern. However, widening the space between electrode units makes the circuit board too large.

SUMMARY OF THE INVENTION

Thus, it is an object of the invention to provide a printed circuit board, and a method of manufacturing the printed circuit board, wherein the formation of soldering bridges is prevented without making the printed circuit board large, even if the parts to be soldered are separated by extremely small pitches.

A printed circuit board in accordance with an embodiment of the invention includes an electrically insulated board. A plurality of patterns that include electrically conductive members are provided on the printed circuit board. Electrode units for electrical connection are provided at a tip section of the pattern. The electrode units are provided adjacent to each other and are separated by a space. Electrically insulated covering members cover the pattern except for the electrode units. Electrically insulated separation members are provided in the space between the electrode units.

A printed circuit board in accordance with another embodiment of the invention includes an electrically insulated board. A plurality of patterns that include electrically conductive members are provided on the board. Electrode units for electrical connection are provided at a tip section of the pattern. The electrode units are provided adjacent to each other and are separated by a space. Electrically insulated covering members cover the pattern except for the electrode units. The electrically insulated covering members cover the pattern in such manner that the space between adjacent electrode units at a boundary side of the covered units and the electrode units is larger than at a tip side of the electrode units. Electrically insulated separation members are provided in the space between the electrode units.

The separation members may be extended to the covering member, which are covered to widen the space between adjacent electrode units at the boundary side.

A method of manufacturing a printed circuit board in accordance with an embodiment of the invention includes providing a plurality of patterns that include electrically conductive members on an electrically insulated board. The method includes a step of providing electrode units for electrical connection at a tip section of the pattern. The electrode units are provided adjacent to each other and are separated by a space. The method includes a step of covering the pattern except for the electrode units. The method also includes a step of providing electrically insulated separation members in the space between adjacent electrode units.

A method of manufacturing a printed circuit board in accordance with another embodiment of the invention includes providing a plurality of patterns that include electrically conductive members on an electrically insulated board. The method includes a step of providing electrode units for electrical connection at a tip section of the pattern. The electrode units are provided adjacent to each other and are separated by a space. The method includes a step of covering the pattern except for the electrode units such that the space between adjacent electrode units at a boundary side of the covered units and the electrode units is larger than at a tip side of the electrode units. The method also includes a step of providing electrically insulated separation members in the space between adjacent electrode units.

In the method of manufacturing a printed circuit board, another step may be used to provide the separation members on the covering members, which are covered to widen the space between adjacent electrodes at the boundary side.

Moreover, the separation members may be silk to enable silk printing on the printed circuit board.

In accordance with the invention, the electrically insulated separation members are provided in the space between adjacent electrodes of the patterns which are provided on the printed circuit board. The separation members prevent solder from moving to adjacent electrode units, even when a large amount of solder is attached to the electrode units. Thus, the formation of soldering bridges between adjacent electrode is prevented. As a result, the yield of the production line is improved and the repair process in the production line is minimized.

The space at a boundary side of the covered units and electrode units is larger than the space at a tip side of adjacent electrode units which are provided on the board. Thus, the amount of solder at the boundary section, where solder tends to pool when soldering is performed, due to the movement of the soldering iron from the tip side towards the boundary side, can be reduced. As a result, soldering bridges are prevented from forming between adjacent electrode units.

The separation members may be formed of silk to enable silk printing on the printed circuit board. Thus, the thickness of the silk layer that is used as a separation member becomes larger than the thickness of the covering member layer. This ensures that solder is prevented from moving between adjacent electrode units. Moreover, the silk is provided as a separation member by a silk printing process which is performed during the normal manufacturing process of the printed circuit board. Thus, a separate step for providing the separation member is obviated, which reduces costs.

Further objects, details and advantages of the invention will be apparent from the following detailed description, when read in conjunction with the drawings.

DETAILED DESCRIPTION OF THE PREFERRED EMBODIMENTS

Figure 1:
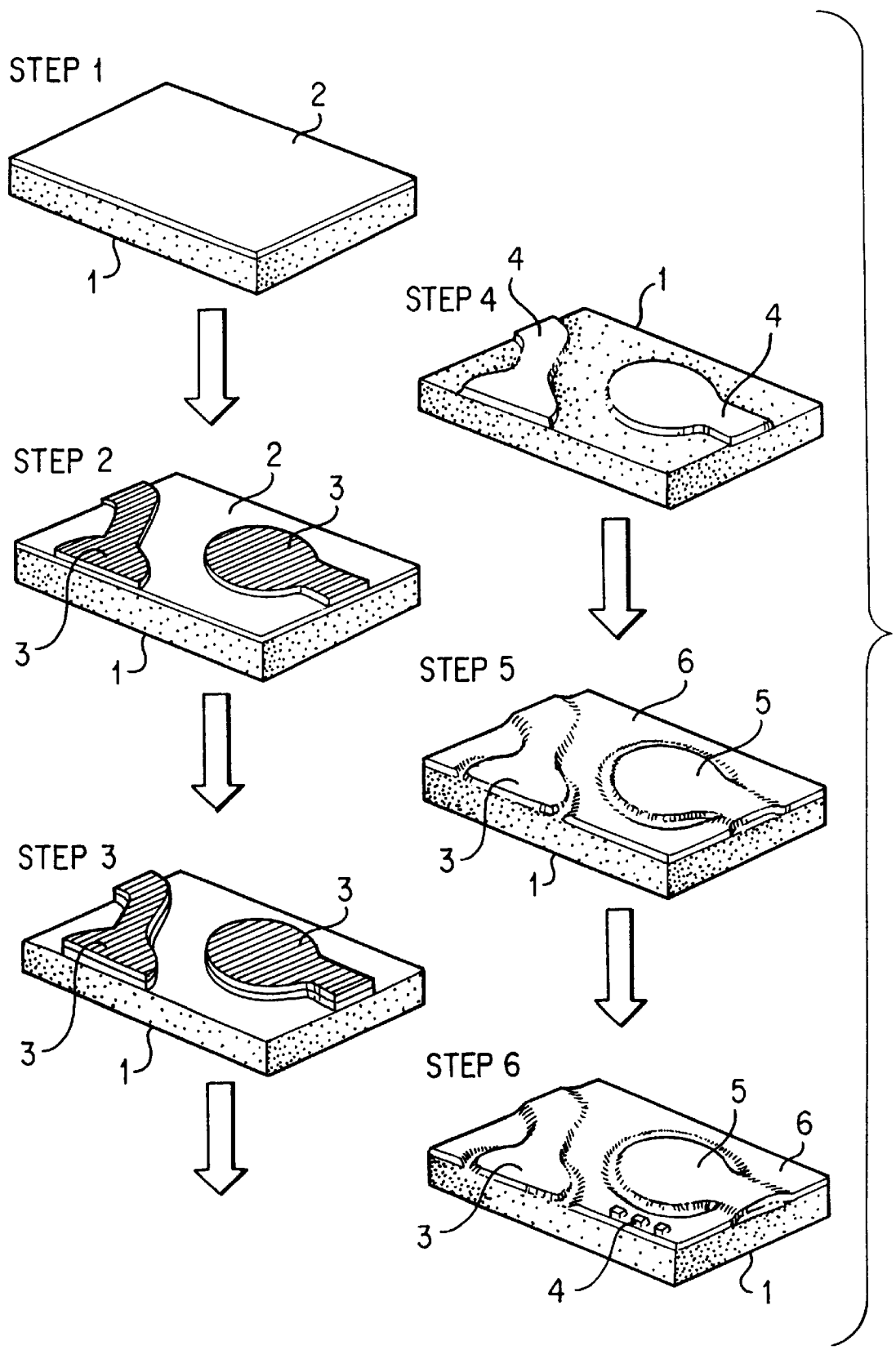
FIG. 1 shows a manufacturing process of a printed circuit board in accordance with an embodiment of the invention.
Figure 2:
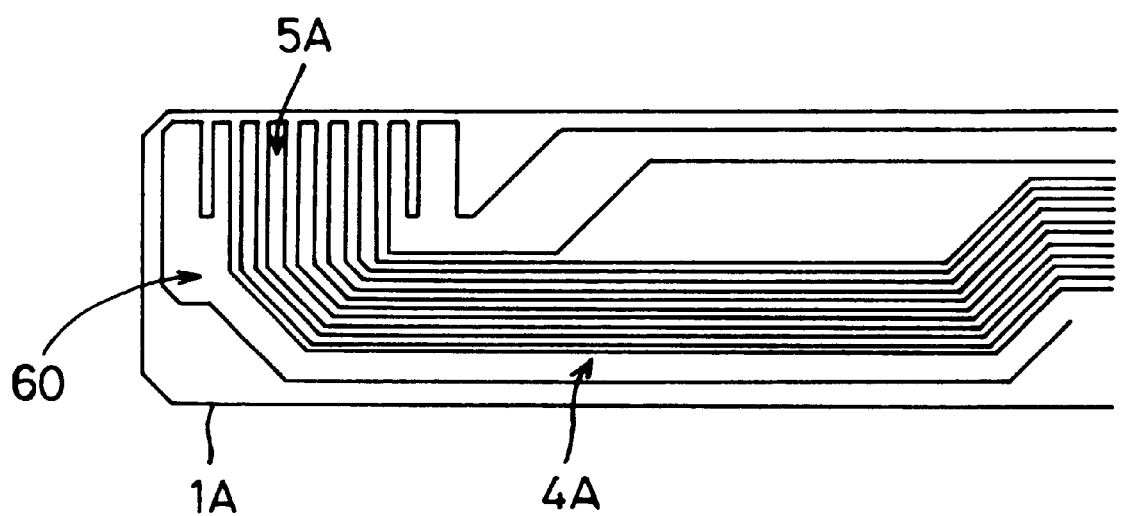
FIG. 2 is a top elevational view showing patterns on a printed circuit board in accordance with an embodiment of the invention.
Figure 3:
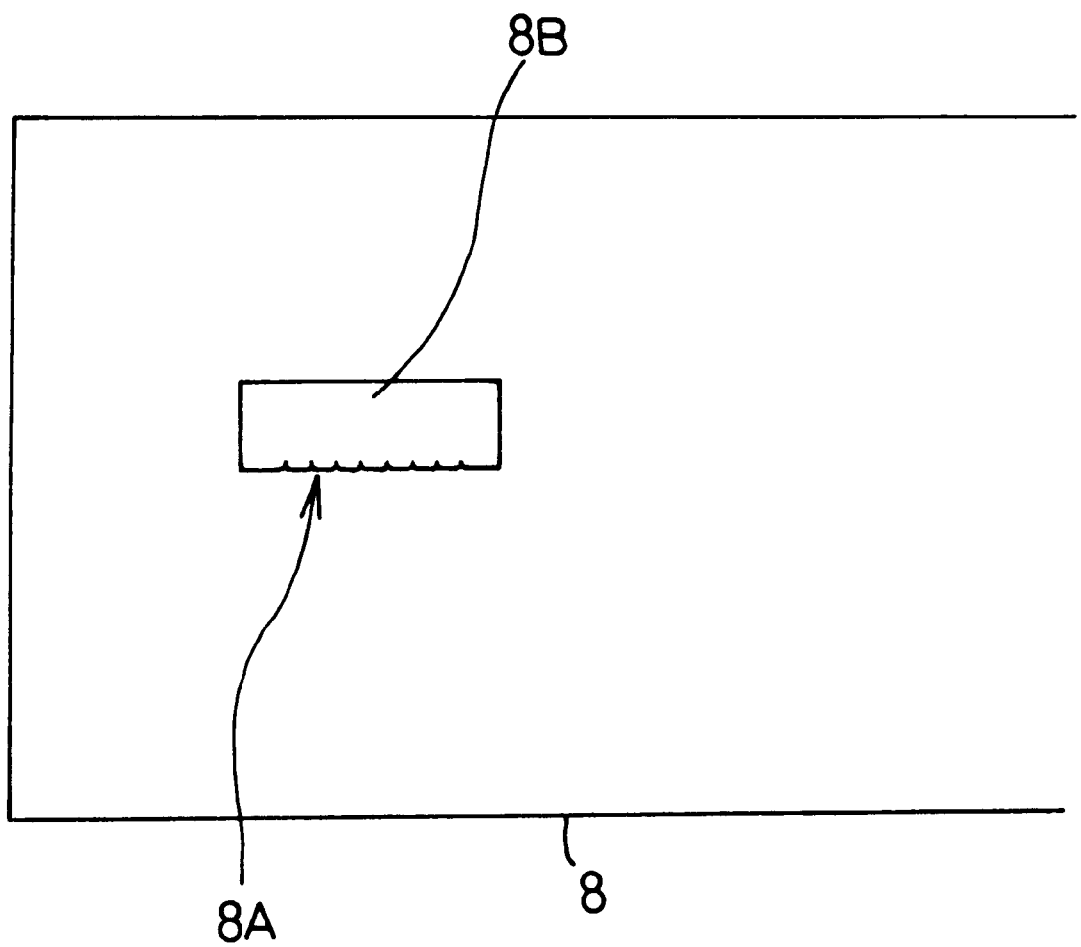
FIG. 3 is top elevational view showing a silk printing sheet which is used to provide a covering member on a printed circuit board in accordance with an embodiment of the invention.
Figure 4:
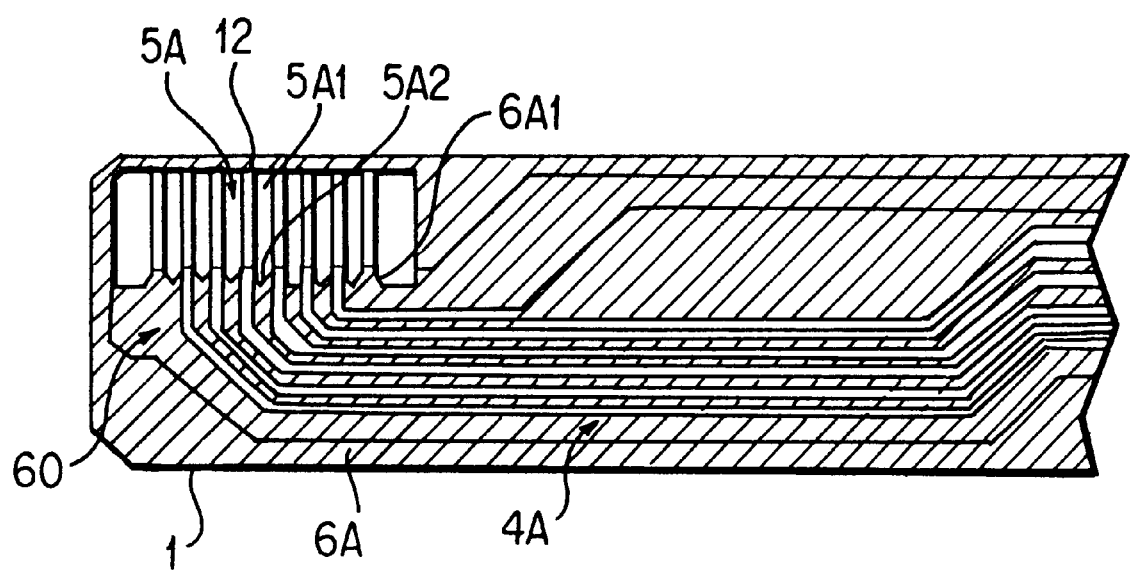
FIG. 4 is an enlarged top elevational view showing the location of electrode units after covering members are provided on a printed circuit board in accordance with an embodiment of the invention.

FIG. 2 shows patterns of a printed circuit board in accordance with an embodiment of the invention. Specifically, FIGS. 2 and 4 show adjacent electrode units 5A. FIG. 4 shows a covering member 6A provided on a covered section 60 having adjacent electrode units 5A. The covering member 6A is provided on the covered section 60 by using a printing sheet 8, which is shown in FIG. 3. The printing sheet 8 has a transfer pattern 8B that provides the covering member 6A on the covered section 60. The transfer pattern 8B is nontransferable at position 8A, i.e., the transfer pattern 8B does not transfer the covering member 6A at position 8A. Position 8A corresponds to a space 12 between adjacent electrode units 5A at a boundary section 5A2, between the adjacent electrode units 5A and the covering member 6A, is concave in shape.

In accordance with the present embodiment, each heat generating unit of a thermal head is soldered onto each adjacent electrode unit 5A, respectively. As a result, at the boundary section 5A2 between the adjacent electrode units 5A and the covering member 6A, the space between adjacent electrode units 5A is larger than at the tip section 5A1 of the electrode units 5A. Thus, the amount of solder which is pooled in the boundary section 5A2 is minimized. Solder is less likely to attach onto the covering member 6A than onto the electrode units 5A because the covering member 6A is made of resin. Thus, solder tends to pool at a position corresponding to the end of the movement of the solder iron. During soldering, the soldering iron is moved from the tip side towards the boundary section 5A2 side (extension side continuing to the pattern 4A). Generally, elements being soldered are extended toward the tip section 5A1 side. Therefore, the above described moving direction of the solder iron makes the soldering operation smooth since the elements do not interfere with the movement of the soldering iron. Thus, the fact that the space between adjacent electrode units 5A is larger at the boundary section 5A2 reduces the likelihood of solder bridges forming between adjacent electrode units 5A. However, the formation of solder bridges is not completely prevented by only this structure.

Figure 5:
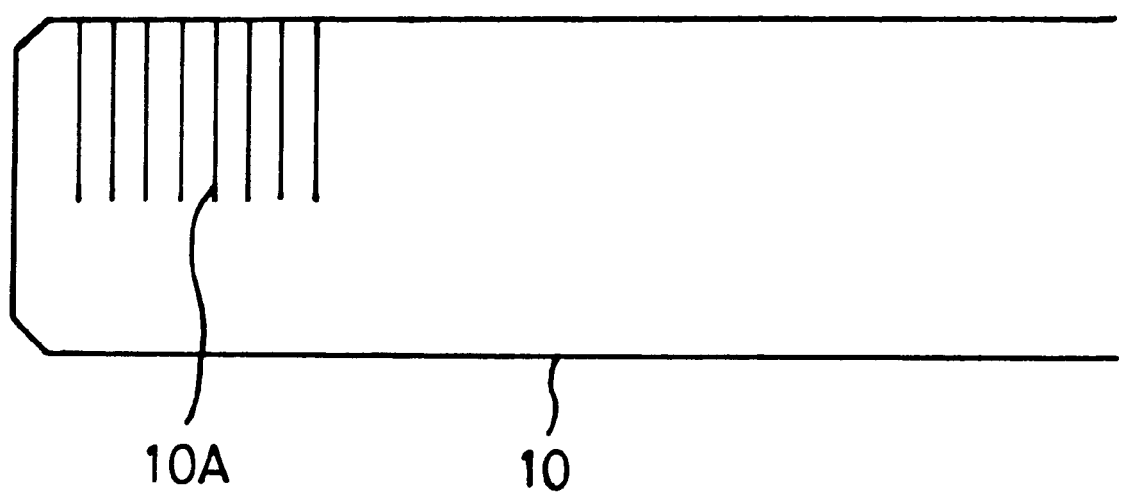
FIG. 5 is a top elevational view showing a silk printing sheet of a printed circuit board in accordance with an embodiment of the invention.

In accordance with the present embodiment, the formation of solder bridges is prevented by first covering with the covering member 6A and then performing printing of the separation member 9. The printing includes silk screen printing separation member 9 in the space 12 between electrode units 5A using a silk printing sheet 10. As shown in FIG. 5, the transfer pattern 10A is provided on the silk printing sheet 10 beforehand in order to print the separation member 9 onto each position corresponding to the space 12 between adjacent electrode units 5A.

Epoxy type resin is used as insulating material for both the separation member 9 and the covering member 6A.

Figure 6:
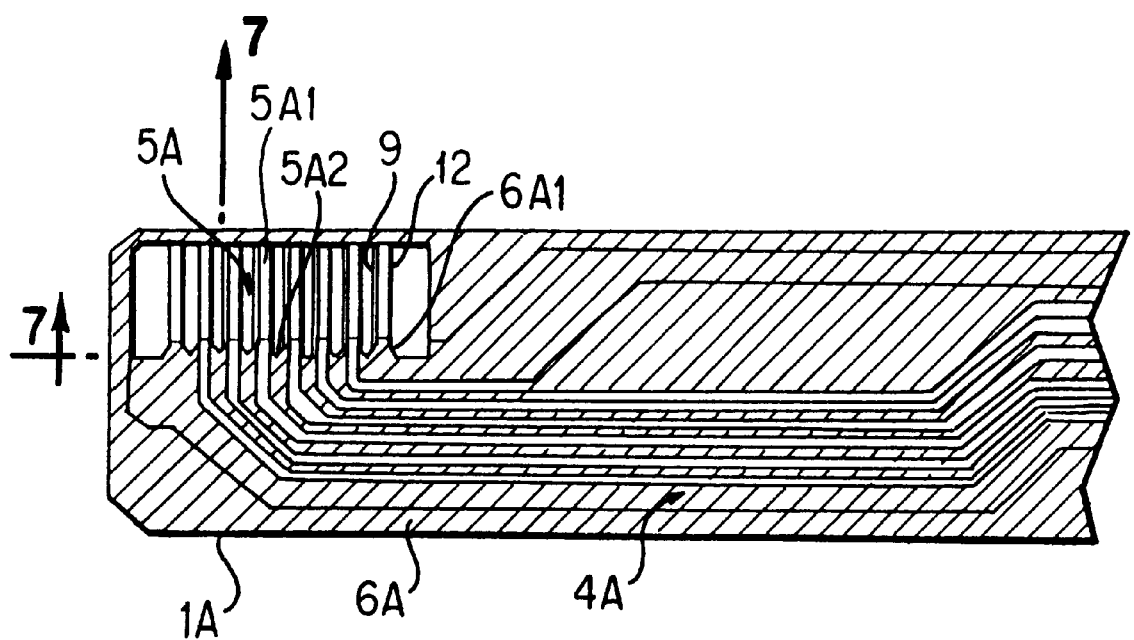
FIG. 6 is an enlarged top elevational view showing the location of electrode units in which silk is provided through silk printing after covering members are provided on the printed circuit board in accordance with an embodiment of the invention.

Thus, as shown in FIG. 6, the separation member 9 is provided at each space 12 between adjacent electrode units 5A, and on the convex shaped section 6A1 of the covering member 6A which covers the boundary section 5A2. Thus, the movement of solder from one electrode unit 5A to another electrode unit 5A adjacent to the one is prevented, and solder bridges cannot be formed between adjacent electrode units 5A.

Figure 7:
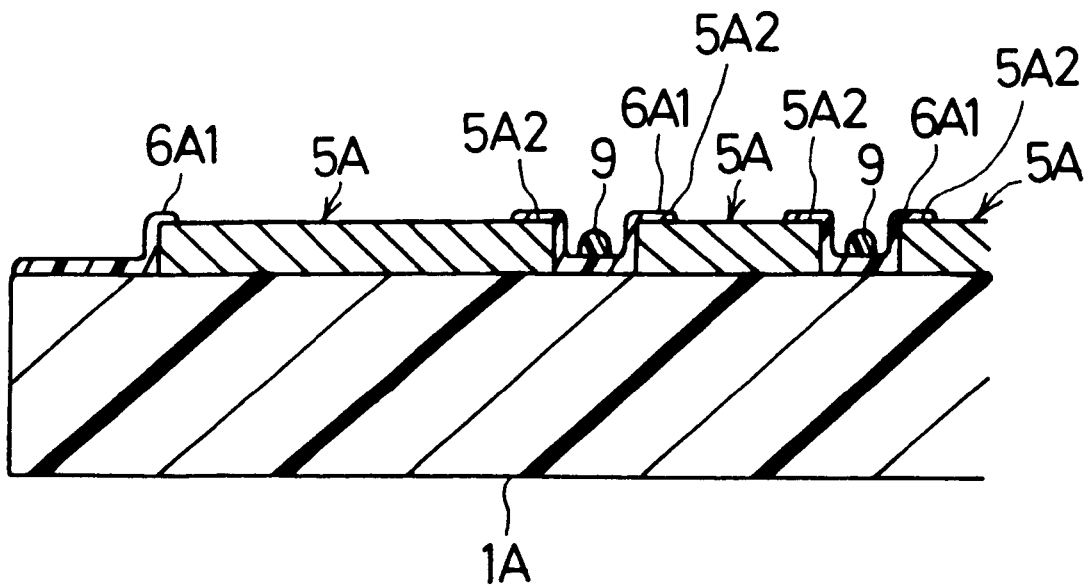
FIG. 7 is a sectional view taken along plane 7—7 of FIG. 6 in accordance with an embodiment of the invention.

Specifically, as shown in FIG. 7, which is a sectional view taken along plane 7—7 of FIG. 6, the separation member 9 is provided on the convex shaped section 6A1 of the covering member 6A, which covers the boundary section 5A2 of the electrode unit 5A. This structure reliably prevents the movement of solder to adjacent electrode units 5A.

Figure 8:
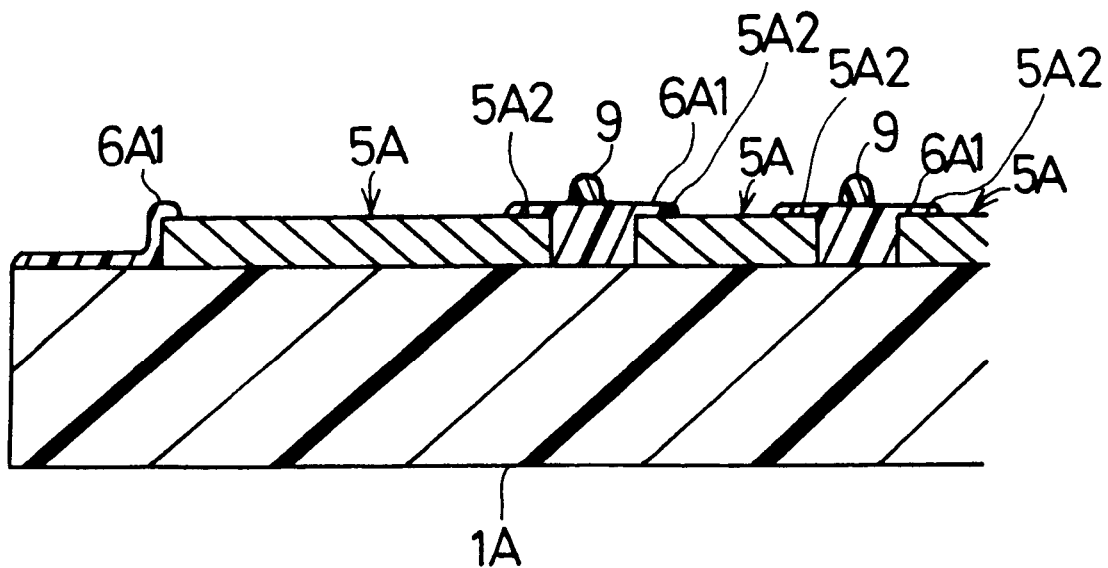
FIG. 8 is a sectional view showing another embodiment of the apparatus of FIG. 7.

In accordance with the present embodiment, the thickness of the covering member 6A is about 8 $\mu$m, the thickness of the electrode unit 5A is about 35 $\mu$m and the thickness of the separation member 9 is about 15 $\mu$m. Alternatively, the thickness of the covering member 6A at the space 12 of boundary section 5A2 may become thicker than the thickness of the electrode unit 5A as shown in FIG. 8. By providing the separation member 9 with sufficient thickness in the space between the electrode units 5A in the manner described above, the movement of solder from one electrode unit 5A to another electrode unit 5A adjacent to the one and the formation of solder bridges between them are prevented.

The present embodiment describes a case in which the shape of the covering member 6A1 of the boundary section 5A2 between the electrode units 5A and the pattern 4A is made into a convex shape, and the separation member 9 is provided in the space 12 between adjacent electrode units 5A. However, this case is discussed for explanatory purposes only, and the formation of solder bridges may be prevented by only providing the separation member 9 in the space 12.

Additionally, as shown in FIGS. 4 and 6, the present embodiment describes a case in which the covering member 6A1 is formed into a triangular convex shape. However, the invention is not limited to this case. Specifically, other convex shapes are equally as effective in preventing the formation of solder bridges, such as a round convex shape or a square convex shape.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A printed circuit board, comprising:
   an electrically insulated board;
   a pattern including an electrically conductive member, the electrically conductive member including electrode units for electrical connection, the electrode units being provided adjacent to each other and separated by a space at a tip section of the pattern;
   an electrically insulated covering member which covers the pattern except for the electrode units; and
   an electrically insulated separation member which is provided in the space between the electrode units.

2. The printed circuit board according to claim 1, wherein the electrically insulated covering member covers the pattern such that the space between adjacent electrode units in an exposed section at an extended side of the pattern is larger than the space between adjacent electrode units in the exposed section at a tip side of the pattern, the pattern terminating at the tip side.

3. The printed circuit board according to claim 2, wherein the electrically insulated separation member is extended onto the electrically insulated covering member, which covers the pattern to widen the space between adjacent electrode units at the extended side of the pattern.

4. The printed circuit board according to claim 3, wherein the electrically insulated separation member is provided by silk screen printing of the printed circuit board.

5. The printed circuit board according to claim 1, wherein the electrically insulated separation member is provided by silk screen printing of the printed circuit board.

6. A method of manufacturing a printed circuit board, comprising the steps of:
   providing an electrically insulated board;
   providing a pattern that includes an electrically conductive member, the electrically conductive member including electrode units for electrical connection;
   positioning the electrode units for electrical connection on the electrically insulated board such that the electrode units are adjacent to each other and separated by a space at a tip section of the pattern;
   covering the pattern except for the electrode units with an electrically insulated covering member; and
   providing an electrically insulated separation member in the space between adjacent electrode units.

7. The method of manufacturing the printed circuit board according to claim 6, wherein the step of covering the pattern except for the electrode units includes covering the pattern such that the space separating adjacent electrode units in an exposed section at an extended side of the pattern is larger than the space separating adjacent electrode units in the exposed section at a tip side of the pattern, the pattern terminating at the tip side.

8. The method of manufacturing the printed circuit board in accordance with claim 6, further including providing the electrically insulated separation member on the electrically insulated covering member which covers the pattern to widen the space between adjacent electrode units at the extended side of the pattern.

9. The method of manufacturing the printed circuit board according to claim 8, wherein the electrically insulated separation member is printed on the electrically insulated covering member by silk screen printing of the printed circuit board.

10. The method manufacturing the printed circuit board according to claim 6, wherein the electrically insulated separation member is printed on the electrically insulated covering member by silk screen printing of the printed circuit board.

11. A printed circuit board, comprising:
    an electrically insulated board;
    a pattern including an electrically conductive member, the electrically conductive member including electrode units for electrical connection;
    positioned electrode units for electrical connection on the electrically insulated board such that the electrode units are adjacent to each other and separated by a space at a tip section of the pattern;
    means for covering the pattern except for the electrode units with an electrically insulated covering member; and
    means for providing an electrically insulated separation member in the space between adjacent electrode units.

12. A printed circuit board, comprising;
    an electrically insulated board;
    a pattern including an electrically conductive member, the electrically conductive member including electrode units for electrical connection, the electrode units being provided adjacent to each other and separated by a space at a tip section of the pattern; and
    an electrically insulated covering member which covers the pattern except for the electrode units such that the space between adjacent electrode units in an exposed section at an extended side of the pattern is larger than the space between adjacent electrode units in the exposed section at a tip side of the pattern, the pattern terminating at the tip side.

* * * * *